United States Patent [19]

Yokomaku

[11] Patent Number: 5,764,530
[45] Date of Patent: Jun. 9, 1998

[54] APPARATUS AND METHOD FOR GENERATING CIRCUIT NET LIST FROM MASK PATTERN DATA

[75] Inventor: Hitoshi Yokomaku, Kasugai, Japan

[73] Assignees: Fujitsu Limited, Kawasaki; Fujitsu VLSI Limited, Kasugai, both of Japan

[21] Appl. No.: 398,680

[22] Filed: Mar. 6, 1995

[30] Foreign Application Priority Data

Mar. 17, 1994 [JP] Japan ................................ 6-047478

[51] Int. Cl.$^6$ ............................................. G06F 17/50
[52] U.S. Cl. ................... 364/490; 364/489; 364/491
[58] Field of Search .................... 364/488, 489, 364/490, 491, 578

[56] References Cited

U.S. PATENT DOCUMENTS

| | | | |
|---|---|---|---|
| 4,093,990 | 6/1978 | Koller et al. | 364/491 |
| 4,839,821 | 6/1989 | Murakata | 364/491 |
| 5,363,313 | 11/1994 | Lee | 364/491 |
| 5,377,122 | 12/1994 | Werner et al. | 364/578 |
| 5,392,221 | 2/1995 | Donath et al. | 364/489 |
| 5,404,319 | 4/1995 | Smith et al. | 364/578 |
| 5,416,718 | 5/1995 | Yamazaki | 364/491 |
| 5,416,720 | 5/1995 | Fukui | 364/489 |
| 5,416,722 | 5/1995 | Edwards | 364/491 |
| 5,490,095 | 2/1996 | Shimada et al. | 364/578 |
| 5,493,509 | 2/1996 | Matsumoto et al. | 364/491 |
| 5,493,510 | 2/1996 | Shikata | 364/491 |
| 5,612,893 | 3/1997 | Hao et al. | 364/490 |

*Primary Examiner*—Kevin J. Teska
*Assistant Examiner*—Tyrone V. Walker
*Attorney, Agent, or Firm*—Staas & Halsey

[57] ABSTRACT

A system and method is presented for generating a computer assisted design circuit net list descriptive of a semiconductor integrated circuit design based on mask patterns used during the formation of the semiconductor. Masking pattern data, stored in a library data base, is processed by a central processing unit into primitive elemental circuit data and interconnection data. Coordinate and other information included in the primitive and interconnection data is then simplified. The simplified data is then supplemented to account for data simplification. The supplemented data is further processed to generate a symbolic circuit layout and a primitive net list.

9 Claims, 10 Drawing Sheets

APPARATUS AND METHOD FOR GENERATING CIRCUIT NET LIST FROM MASK PATTERN DATA

BACKGROUND OF THE INVENTION

1. Field of the Invention

The present invention relates to an apparatus and method for generating a net list descriptive of a semiconductor integrated circuit design based on data descriptive of mask patterns used during formation of the integrated semiconductor circuit.

2. Description of the Related Art

Computer aided design (CAD) systems are widely used in designing semiconductor integrated circuits. In particular, CAD systems are used to generate data descriptive of the entire circuit layout as well as the layout of individual circuit cells. Since each cell often contains a large number of circuit elements and interconnections among the elements, CAD systems have become an indispensable tool in the design of semiconductor integrated circuits. In addition to generating layout design, some types of CAD systems generate mask pattern data using circuit layout data. Mask pattern data is used to control various exposure processes necessary for the integrated circuit's manufacture.

Comparatively simple integrated circuit designs are often generated by combining various kinds of mask pattern data stored in the data library. Design generation of this type obviates the need to generate net lists for a specific circuit's overall or elemental design. "Net list", as used here, means a compilation of information descriptive of the primitives (i.e., circuit elements) of a logic circuit. "Net list" can also be descriptive of a cell (as a group of circuit elements) and their interconnection. Some types of integrated circuits require the generation of a net list that describes the various elements in the circuit. For these types of circuits, it is helpful to be able to generate the net list from the mask pattern data.

According to the conventional net list generating methods, circuit element routing information can be obtained by analysis of various mask patterns interconnections. A net list, for example, on the transistors used in a circuit can be produced based on the routing information available by examining the circuit's mask pattern data.

The demand for increasingly larger and more complex integrated circuits has dictated the need for increasingly larger and more complex net lists used during circuit layout design. Unfortunately, conventional net list generating systems and methods require an excessive amount of time and are often inadequately designed to generate the net list on the transistor level.

SUMMARY OF THE INVENTION

Accordingly, it is a primary objective of the present invention to provide net list generating apparatus which generates primitives corresponding to the functional blocks of a circuit design from mask pattern data and which generates primitive level net lists based on the interconnections among the functional or primitive blocks of the circuit design.

To achieve the foregoing and other objects and in accordance with the purpose of the present invention, an improved apparatus is provided, which prepares a net list descriptive of a semiconductor integrated circuit design from mask pattern data used to fabricate the semiconductor integrated circuit.

The apparatus according to the present invention comprises a mask pattern analyzer, a simplification unit, a router unit and a net list generating unit. The mask pattern analyzer separates mask pattern data into primitive data and interconnection data. The separated data describes primitives corresponding to predetermined functional blocks defined in the integrated circuit. Interconnection data describes the patterns of connections made between interconnected primitives. The simplification unit simplifies the interconnection data generated by the mask pattern analyzer by transforming rectangularly descriptive data into linearly descriptive data. The routing unit supplements the simplified data with supplemental interconnection data to compensate for the virtual circuit disconnections resulting during data simplification. The routing unit also produces primitive symbolic layout data based on the primitive, simplified and supplemental interconnection data. The net list generating unit then produces a primitive level net list from the symbolic layout data.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

A circuit design net list generating apparatus according to one embodiment of the present invention will now be described referring to FIGS. 1 through 14.

Figure 1:
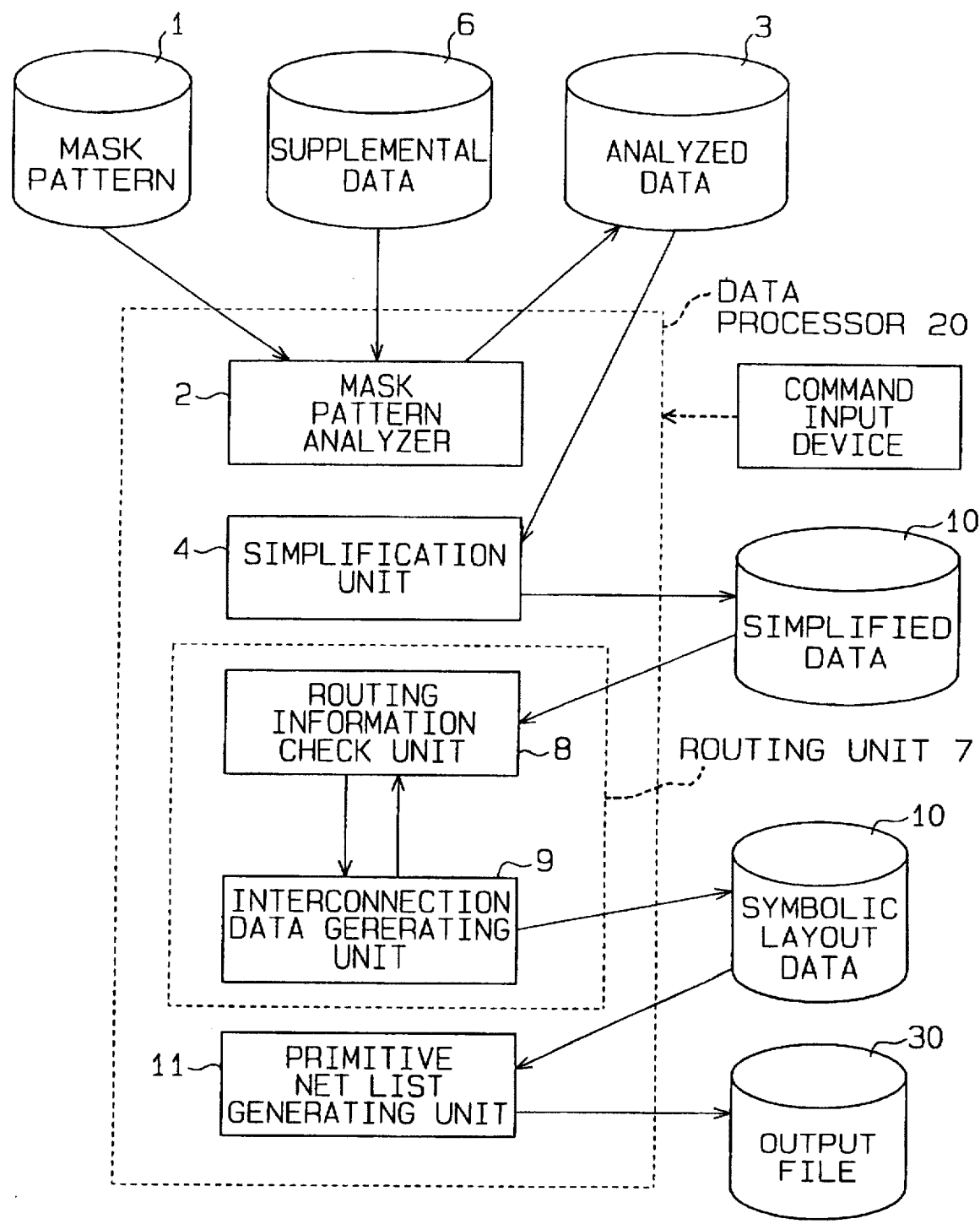
FIG. 1 is a block diagram illustrating circuit design net list generating apparatus according to one embodiment of the present invention.

FIG. 1 shows the schematic structure of a circuit net list generating apparatus. This data generating apparatus is incorporated in a CAD system, which includes a data processor 20 and five data bases as libraries 1, 3, 5, 6 and 10. The data processor 20 includes five units that perform at least five functions. The five units are a mask pattern analyzer 2, a simplification unit 4, a routing information check unit 8, an interconnection data generating unit 9 and a primitive net list generating unit 11. The routing information check unit 8 and the interconnection data generating unit 9 constitute a routing unit 7. The data processor 20 is activated in response to the input from a command input device.

The first library 1 contains various kinds of primitive figure data, prepared and input by a designer using an editor (not shown). Library 1 also contains textual based codes used for specifying and manipulating the various primitive figures.

Figure 2:
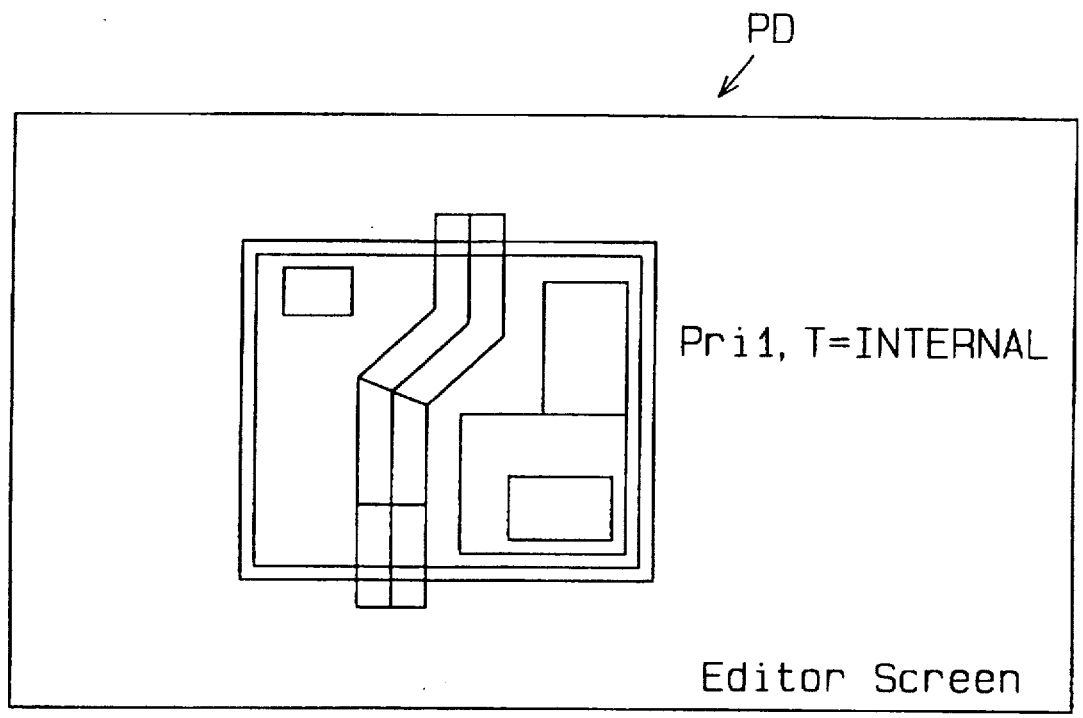
FIG. 2 is a diagram showing one example of a primitive registered by the present invention as a figure.
Figure 3:
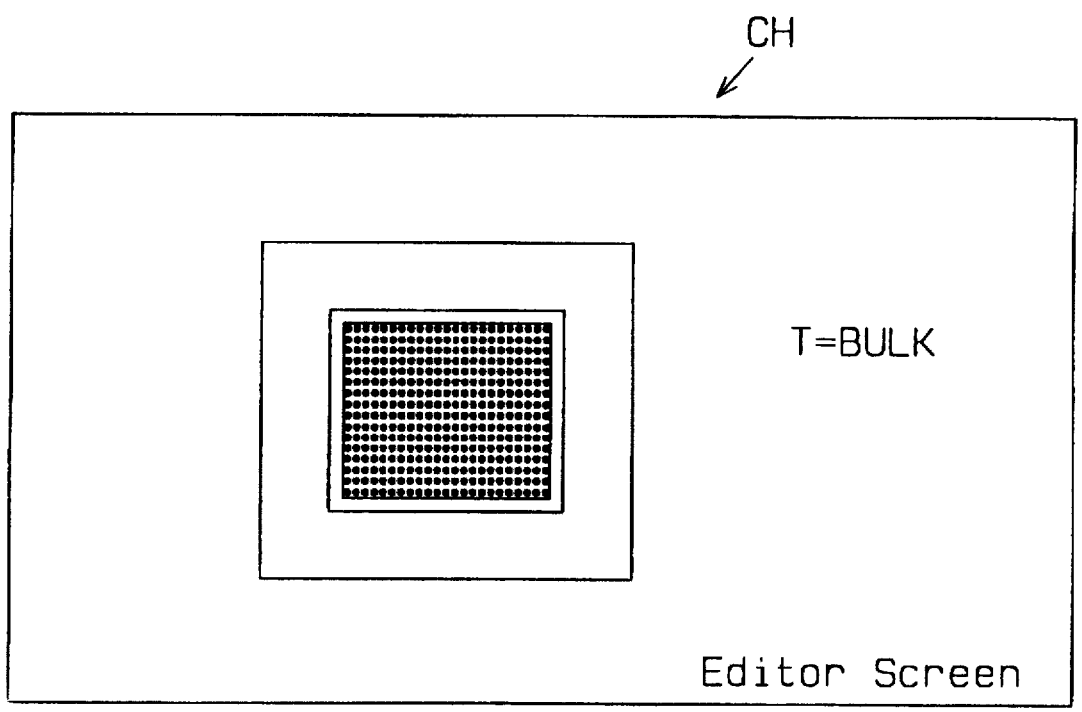
FIG. 3 is a diagram showing a registered figure of a contact hole.

FIG. 2 illustrates, for example, primitive figure data corresponding to a mask pattern and to the pattern's textual based code. The mask pattern forms a CMOS inverter circuit from a pattern of transistors. The text code ("Pri1, T=INTERNAL" in this example) specifies that the figure data has been registered as one primitive in library 1.

Alternatively, primitive figure data along with it's associated textual code may be registered as a primitive that corresponds to a mask pattern of a functional block of a particular circuit. The block could be, for example, a plurality of transistors or other types of primitives designed for a particular logic function. Library 1 further stores contact hole data, as for example that shown in FIG. 3. This type of figure data include a pattern of contact holes and the pattern's related text code "T=BULK".

Figure 4:
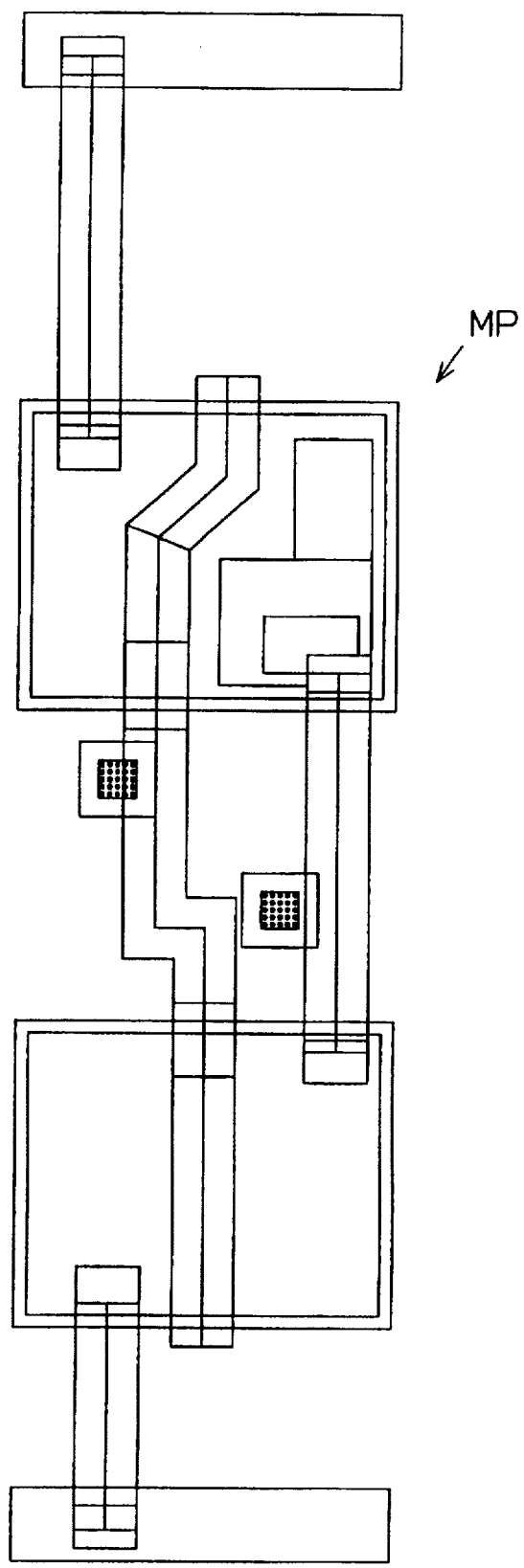
FIG. 4 is a layout diagram showing one example of a mask pattern as data.

Library 1 also stores data on mask patterns associated with particular circuit patterns. This type of data includes, for example, data descriptive of a combination of a primitives, contact holes and their interconnection. FIG. 4 shows one example of a mask pattern MP corresponding to the mask pattern data of a CMOS inverter circuit stored in the library 1.

Figure 5:
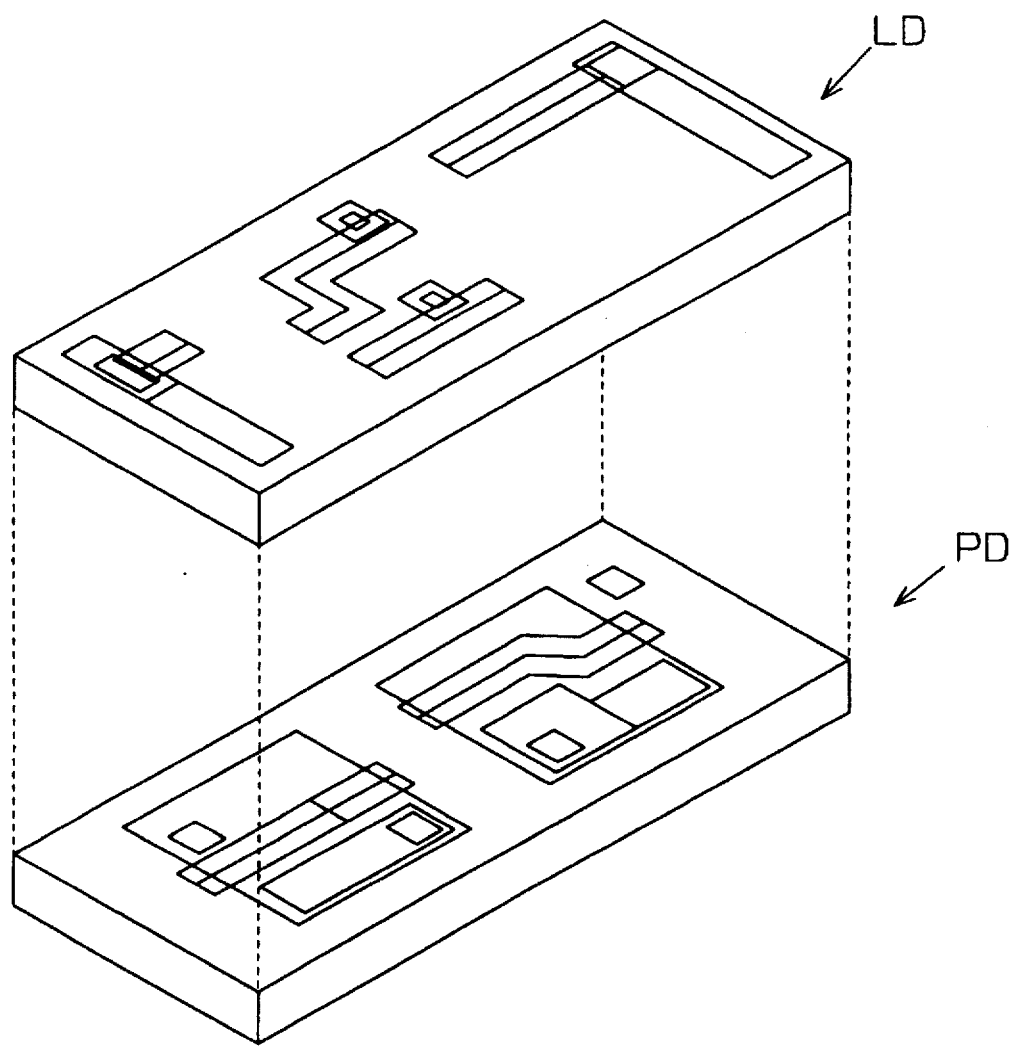
FIG. 5 is a diagram illustrating the concept of separated interconnection data and primitive data.

The mask pattern analyzer 2 reads mask pattern data from the first library 1 and identifies a primitive included in the mask pattern data by referring to the associated text code. The analyzer 2 then separates the mask pattern data into a hierarchical form of interconnection and primitive data. The particular hierarchy of data consists of separate levels of individual or combinations of mask patterns. For instance, as shown in FIG. 4 the data on the mask pattern MP of a CMOS inverter circuit is hierarchically separated into interconnection data LD and primitive data PD. As shown in FIG. 5, data LD and PD describe a primitive having a P channel MOS transistor and an N channel MOS transistor. The separated interconnection and primitive data is then stored in the second library 3.

Figure 6:
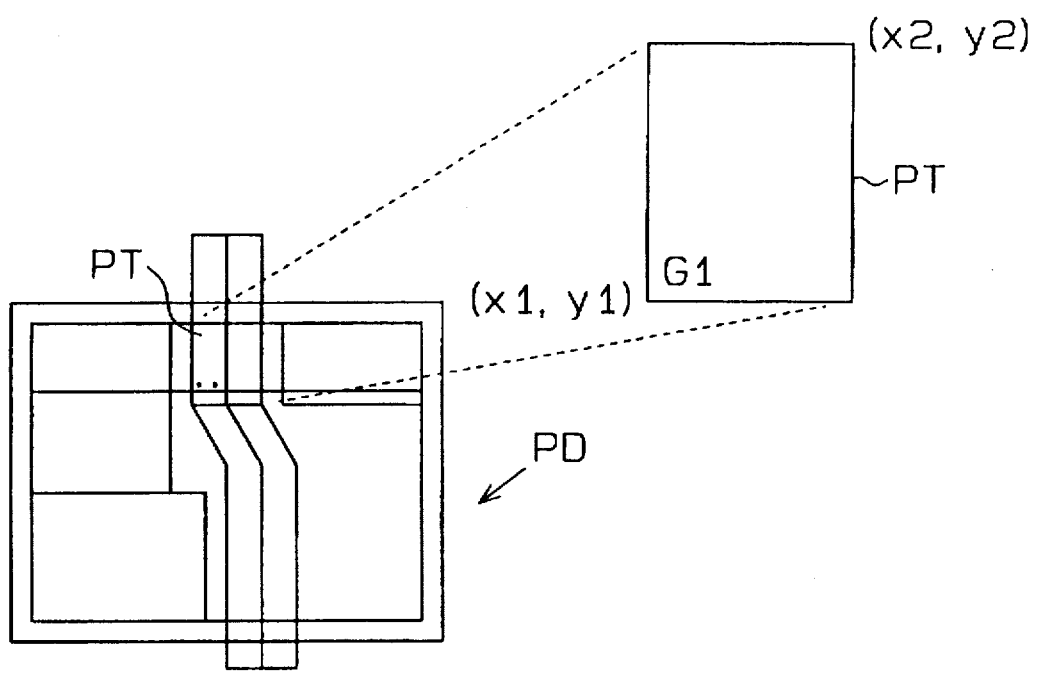
FIG. 6 is a diagram illustrative of supplemental figure data.

The mask pattern analyzer 2 acquires primitive pattern terminal PT data including the text code G1 from the third library 6, where supplemental data of mask patterns is stored, as shown in FIG. 6. The mask pattern analyzer 2 then aligns the primitive terminal PT, at the gate portions of the transistors, as the primitive data PD. This primitive terminal PT is registered as a rectangular figure defined by the coordinates of two corners, the minimum coordinates (x1, y1) and the maximum coordinates (x2, y2). This primitive terminal designates the position of the connection between the primitive and simplified interconnection described below. Primitive terminal data is also stored together with the primitive data PD in the second library 3.

The simplification unit 4 reads the interconnection data LD and primitive data PD from the second library 3, and performs a simplification process, as discussed in the following paragraphs (1) to (3).

Figure 7:
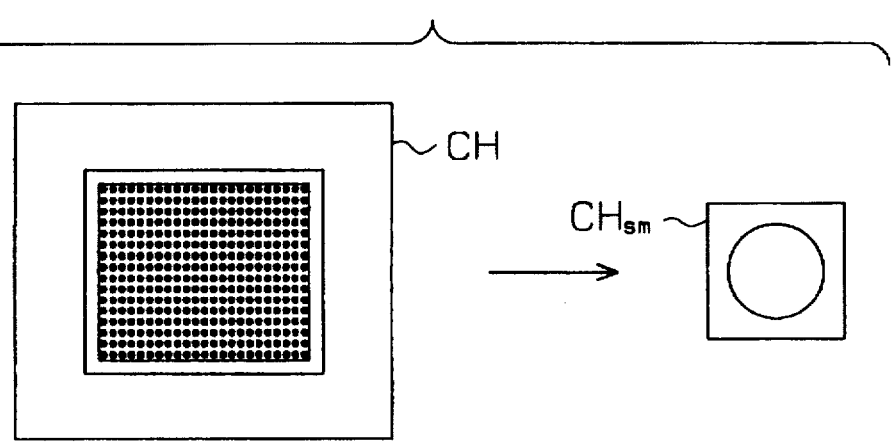
FIG. 7 is a diagram illustrating the simplification of contact hole data.

(1) As part of the interconnection data LD, contact hole data CH, preset and stored in library 6, is transformed to simplified contact hole data $CH_{sm}$ and stored in the fourth library 5 as illustrated in FIG. 7.

Figure 8:
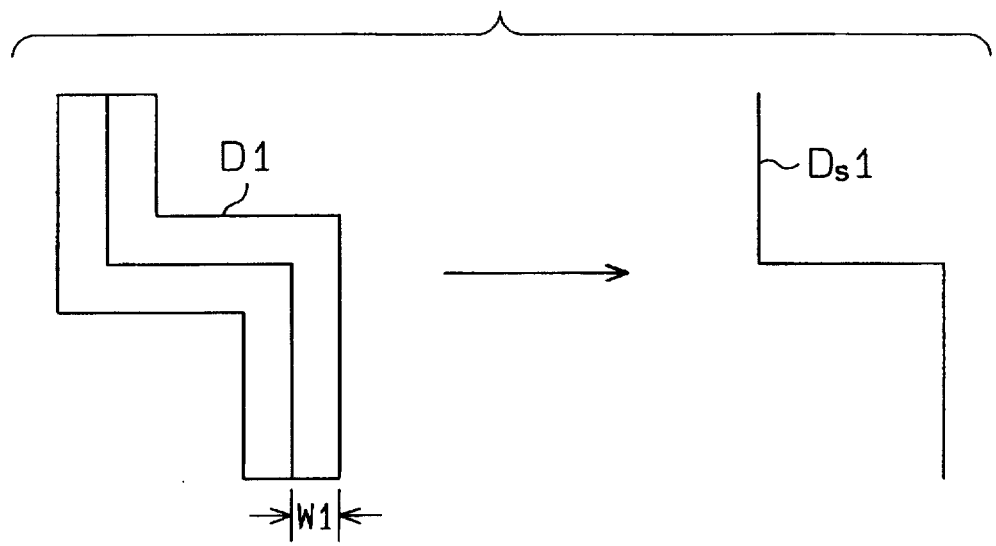
FIG. 8 is a diagram illustrating the simplification of interconnection data.

(2) As shown in FIG. 8, interconnection coordinate data D1, is representative of a rectangular pattern or a composite of rectangular patterns and has a width W1 with reference to its center line. This pattern is transformed and simplified into a line Ds1 having linear coordinates without a specified width. Simplified interconnection data Ds1 is then stored in the fourth library 5.

As an illustration of this, the interconnection data D1 in the second library 3 may, for example, have a text code of "LINE" and be described as follows.

LINE (1, 2), (1, 1), (2, 1), (2, 0), W1=0.5

The simplification unit 4 transforms this interconnection data D1 to the following data of three lines, each of which connects at two points, but is absent information on width W1. Each line data has a text code of "WIRE" and is described as follows.

WIRE (1, 2) (1, 1)
WIRE (1, 1) (2, 1)
WIRE (2, 1) (2, 0)

Those line data are stored as simplified interconnection data Ds1 in the fourth library 5.

Figure 9:
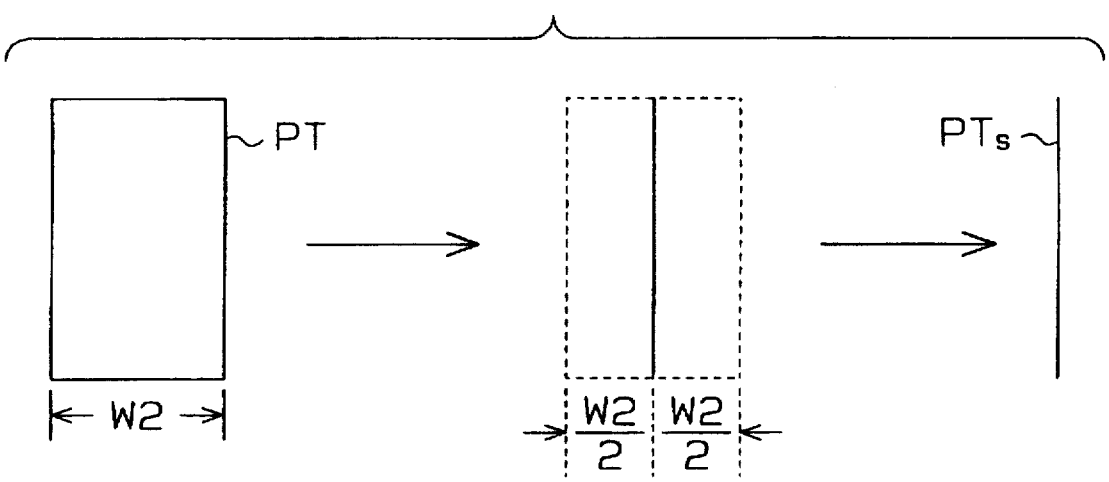
FIG. 9 is an diagram illustrating the simplification of primitive terminal data.

(3) As illustrated in FIG. 9, the primitive terminal data PT of width W2 is transformed from a rectangular shape into a line shape or pattern as primitive terminal data PTs. Data PTs is expressed with reference to the center line of the data PT and stored in the fourth library 5.

One illustration of this could be, for example, where the primitive terminal data in the second library 3 has a text code "RECT", and where the coordinate and direction data are as follows:

RECT (MIN=1, 1) (MAX=3, 4), D=L

"MIN" indicates the minimum coordinates, "MAX" indicates the maximum coordinates, "D" is the direction and "L" indicates that the direction is vertical. The simplification unit 4 transforms this primitive terminal data PT to the following data of a vertical line defined by two points.

WIRE (2, 1) (2, 4)

The vertical line data has a text code of "WIRE" and is described as above. This line data is stored as simplified primitive terminal data PTs in the fourth library 5.

The simplified data stored in the fourth library 5 is subject to having it's connection status checked by the routing unit 7. Specifically, the simplified data is processed by the routing information check unit 8 and the interconnection data generating unit 9. When disconnection of the circuit routing originating from the data simplification process is found, the routing unit 7 generates new interconnection data to restore proper circuit routing.

Figure 10A:
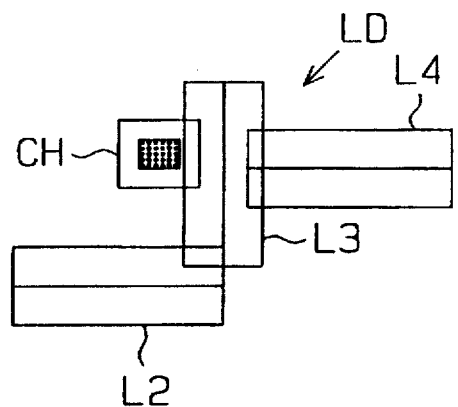
FIGS. 10A, 10B and 10C are diagrams illustrating the operations of simplification and connection maintenance.
Figure 10B:
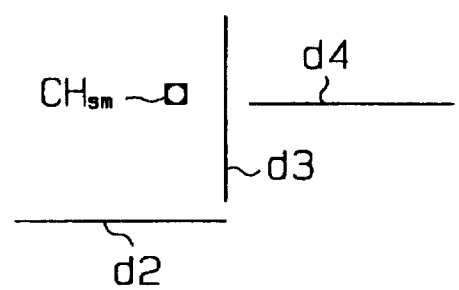

When interconnection data LD (including the interconnections L2, L3, L4 and contact hole CH) as shown in FIG. 10A is transformed into simplified interconnections d2, d3 and d4 and contact hole $CH_{sm}$ as shown in FIG. 10B, each of the simplified interconnections are disconnected, as is the contact hole. The routing information check unit 8 determines if the simplified interconnections data indicates that a connection exists between the simplified interconnections and contact hole. When a disconnection between interconnections is detected, the interconnection data generating unit 9 generates new interconnection data that compensates for the disconnected portion.

This will be described more specifically with reference to the interconnection data LD shown in FIG. 10A. There, the interconnection L2 is connected to the interconnection L3, and the interconnection L3 is connected to the interconnection L4 and the contact hole CH. The interconnection data LD is expressed as one net described as follows.

NET1=L2–L3CH–L4 ... (NL1)

The individual simplified data shown in FIG. 10B is respectively expressed as three nets and an unconnected simplified contact hole $CH_{sm}$:

NET2=d2
NET3=d3
NET4=d4
$CH_{sm}$

Figure 10C:
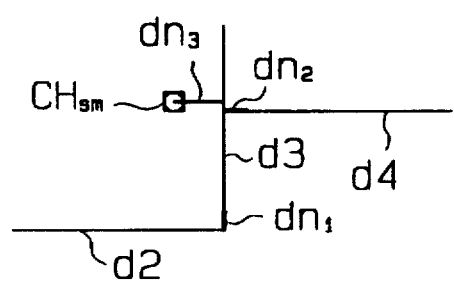

Due to the difference in expression of the interconnection data LD and the simplified data d2, d3, d4, and $CH_{sm}$, the routing information check unit 8 detects disconnections between the simplified interconnections d2, d3 and d4 and the simplified contact hole. The interconnection data generating unit 9 then generates new interconnection data that compensates for the disconnected portions. Specifically, as shown in FIG. 10C, the interconnection data generating unit 9 generates interconnection data dn1 connecting the simplified interconnections d2 and d3, interconnection data dn2 connecting the simplified interconnections d3 and d4, and interconnection data dn3 connecting the simplified interconnection d3 to the simplified contact hole $CH_{sm}$. As a result, the simplified interconnection data shown in FIG. 10C is expressed as one net described below.

NET1'=d2dn1–d3dn3$CH_{sm}$–d4dn2 ... (NL2)

Next, the routing information check unit 8 compares the net list (NL1) of the interconnection data LD, shown in FIG. 10A, with the net list (NL2) of the simplified interconnection data to check again if the simplified interconnections data are connected to one another. If the net list (NL1) and the net list (NL2) suggest the same routing relation, it is determined that the simplified interconnections are connected to one another.

Figure 11:
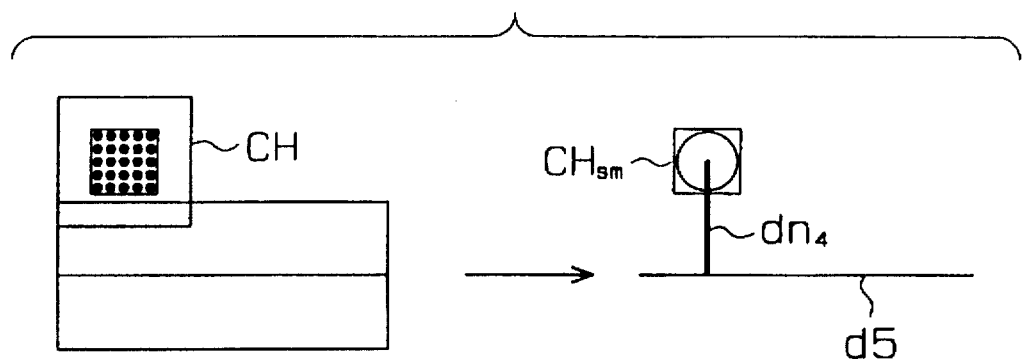
FIG. 11 is a diagram showing one example of the simplification operation and routing operation.
Figure 12:
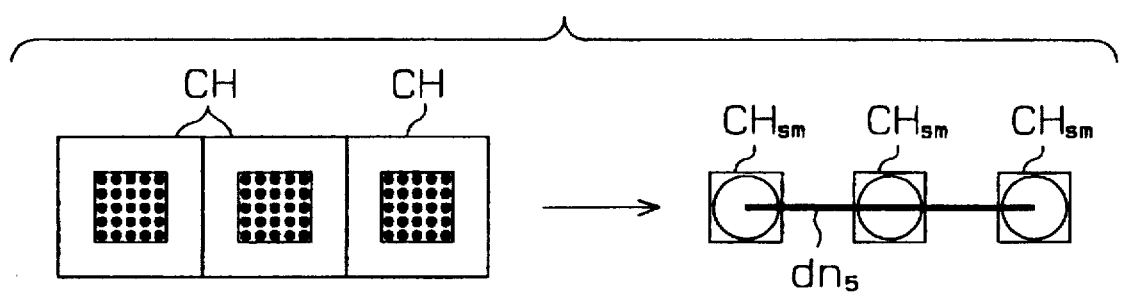
FIG. 12 is a diagram showing another example of the simplification operation and routing operation.
Figure 13:
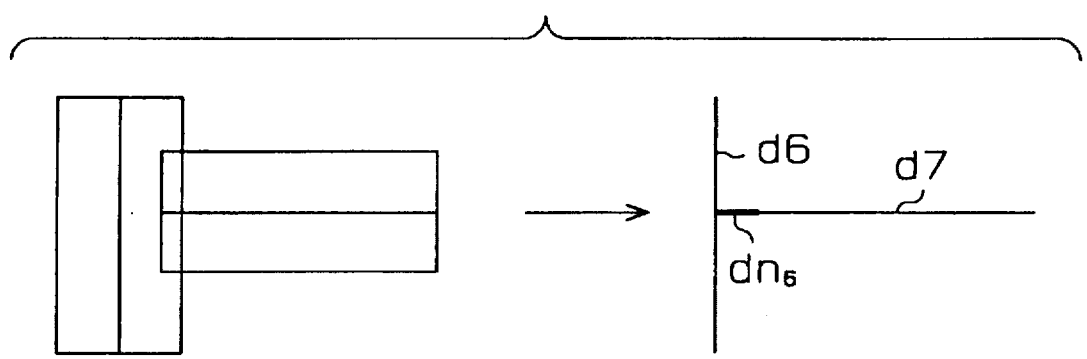
FIG. 13 is a diagram showing a further example of the simplification operation and routing operation.

Likewise, the routing unit 7, comprising the routing information check unit 8 and the interconnection data generating unit 9, generates various kinds of interconnection data. This interconnection data virtually connects the circuit elements disconnected during the simplification process. FIG. 11 shows the interconnection dn4 connecting the disconnected simplified interconnection d5 and simplified contact hole $CH_{sm}$ together. FIG. 12 shows the interconnection dn5 connecting a plurality of simplified contact holes $CH_{sm}$. FIG. 13 shows interconnection data dn6 connecting two simplified interconnections d6 and d7 together.

Figure 14:
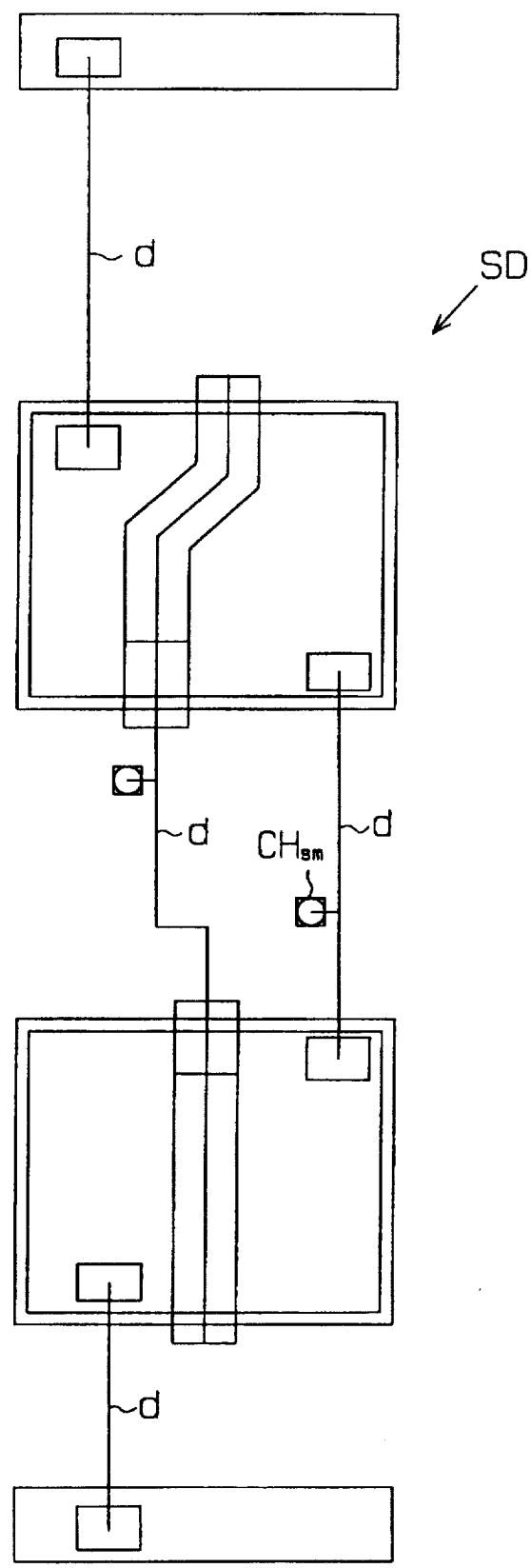
FIG. 14 is a diagram showing symbolic layout data.

The new data dn1 to dn6 generated in the above manner are stored in the fifth library 10. The data of the mask pattern MP of the CMOS inverter circuit, shown in FIG. 4, is stored in the fifth library 10 as symbolic layout data SD. Data SD consists of primitive data, simplified interconnection data, d, and simplified contact holes $CH_{sm}$, the latter two being obtained by the simplification of the interconnection data LD, as shown in FIG. 14.

The primitive net list generating unit 11 shown in FIG. 1 reads the symbolic layout data SD from the fifth library 10, and prepares the net list on the primitive level based on the routing information between individual primitives. This net list is output to an output file 30 provided in a format manipulatable by an operator of the computer. The net list can be displayed on a display (not shown).

The layout data generating apparatus according to this embodiment can separate mask pattern data MD into primitive data PD and interconnection data LD, in addition to simplifying the interconnection data LD to generate symbolic layout data SD. Based on the routing information of the symbolic layout data SD, the layout data generating apparatus can generate the net list on the primitive level.

Although only one embodiment of the present invention has been described herein, it should be apparent to those skilled in the art that the present invention may be embodied in many other specific forms without departing from the spirit or scope of the invention.

Figure 15:
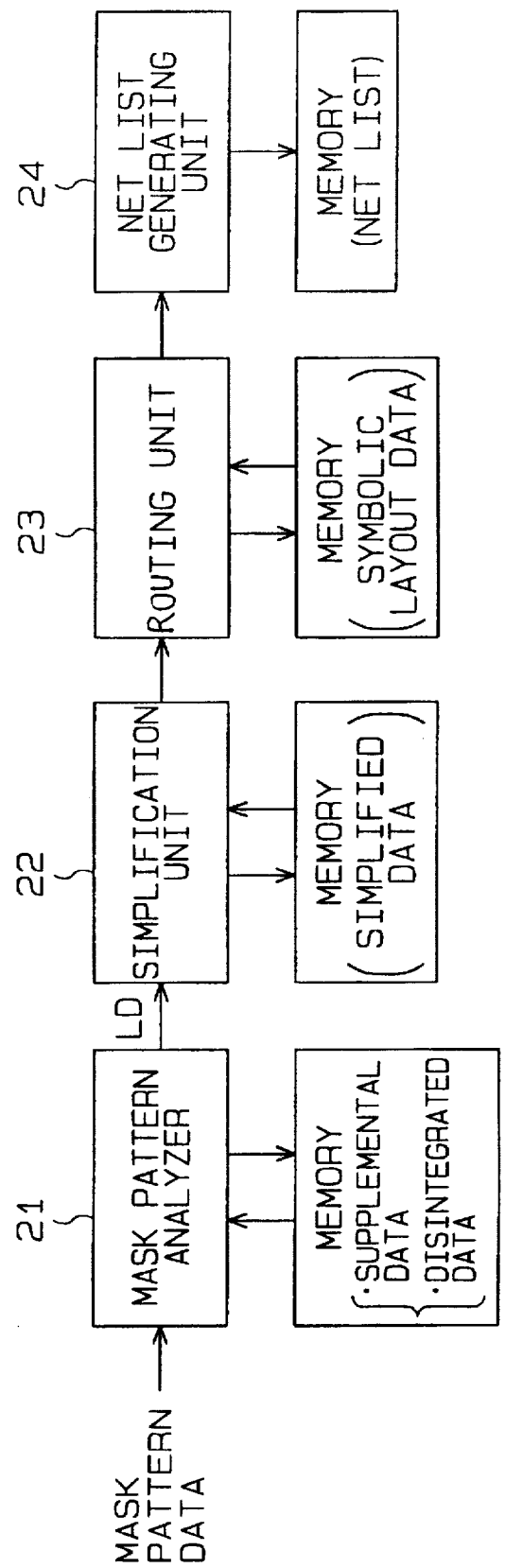
FIG. 15 is a diagram illustrating another example of the net list generating apparatus according to the present invention.

For instance, although the data processor 20 including the individual units 2, 4, 8, 9 and 11 is incorporated in the CAD system in the above-described embodiment, a mask pattern analyzer 21, a simplification unit 22, a routing unit 23, and a net list generating unit 24 may be formed by independent circuits each having a data memory, as shown in FIG. 15.

Therefore, the present example and embodiment are to be considered as illustrative and not restrictive and the invention is not to be limited to the details given herein, but may be modified within the scope of the appended claims.

What is claimed is:

1. An apparatus for computer assisted design of a semiconductor integrated circuit producing a computer generated net list of circuit design information based on mask pattern data descriptive of a mask pattern used in the formation of the integrated circuit, said apparatus comprising:

a mask pattern analyzer generating primitive and interconnection data from said mask pattern data, said primitive data being descriptive of a functional circuit primitive, and said interconnection data being descriptive of the connections made between the primitives of said circuit;

a simplification unit, responsive to input of analyzed mask pattern data, simplifying expression of said interconnection data into simplified interconnection data;

a router unit, responsive to input from the simplification unit, generating routing data to supplement said simplified interconnection data with additional interconnection data, and generating symbolic layout data on a primitive level of the integrated circuit based on said primitive data, the simplified interconnection data, and the additional interconnection data; and a net list generating unit producing a primitive level net list from said symbolic layout data.

2. The apparatus according to claim 1, wherein said mask pattern analyzer receives the mask pattern data from a mask pattern data library, and outputs analyzed data to an analyzed mask pattern data library, wherein said simplification unit receives the analyzed mask pattern data from said analyzed mask pattern data library and outputs the simplified interconnection data to a simplified data library;

wherein said router unit receives the simplified interconnection data from said simplified data library and outputs said the symbolic layout data to a symbolic data library; and wherein said net list generating unit receives said symbolic layout data from a symbolic layout data library and outputs said primitive level net list to an output file.

3. The apparatus according to claim 2, wherein said output file is provided in a format manipulatable by an operator of the computer.

4. The apparatus according to claim 1, wherein said interconnection data produced by said pattern analyzer comprises contact hole data, wherein said interconnection data comprises rectangular coordinate data, and wherein said simplification unit transforms said contact hole data into predetermined simple figure information and transforms said interconnection data into linear coordinate data.

5. The apparatus according to claim 1, further comprising a library as a data base, connected to said pattern analyzer, registering mask pattern data and data of various basic primitives forming a mask pattern, and wherein said mask pattern analyzer refers to data registered in said library to discriminate primitive data from said mask pattern data.

6. The apparatus according to claim 1, wherein said mask pattern analyzer affixes data of a supplementary figure to said primitive data, said supplementary figure specifying a position of a connection between said primitive and said simplified interconnection.

7. The apparatus according to claim 1, wherein said router unit comprises:

a first unit comparing a net list of interconnection data before said simplifying with a net list of simplified interconnection data produced by said simplification unit and detecting a disconnection of said simplified interconnection data; and a second unit generating additional simplified interconnection data compensating for the disconnection.

8. A method of preparing a net list, in computer aided design of a semiconductor integrated circuit, from mask pattern data used to fabricate the semiconductor integrated circuit, said method comprising the steps of:

separating said mask pattern data into primitive data descriptive of patterns of primitives corresponding to predetermined functional blocks of the integrated circuit, and interconnection data descriptive of patterns of interconnections connecting said primitives to one another;

simplifying the separated interconnection data to produce simplified interconnection data;

generating additional interconnection data to compensate for the separation of said simplified interconnection data;

generating primitive level symbolic layout data of said integrated circuit, based on said primitive data, said simplified interconnection data, and said additional interconnection data; and producing the net list on a primitive level from said symbolic layout data.

9. The method according to claim 8, wherein said mask pattern data is input into a computer and the net list is output from said computer.

* * * * *